(12) United States Patent
Yerli (10) Patent No.: US 11,663,769 B2
(45) Date of Patent: May 30, 2023

(54) GAME ENGINE ON A CHIP

(71) Applicant: TMRW Foundation IP S. À R.L., Luxembourg (LU)

(72) Inventor: Cevat Yerli, Frankfurt am Main (DE)

(73) Assignee: TMRW Foundation IP S. À R.L., Luxembourg (LU)

( * ) Notice: Subject to any disclaimer, the term of this patent is extended or adjusted under 35 U.S.C. 154(b) by 0 days.

(21) Appl. No.: 17/694,254

(22) Filed: Mar. 14, 2022

(65) Prior Publication Data

US 2022/0198736 A1  Jun. 23, 2022

Related U.S. Application Data

(63) Continuation of application No. 15/047,556, filed on Feb. 18, 2016, now Pat. No. 11,295,506.

(Continued)

(51) Int. Cl.
*G06T 15/00* (2011.01)
*G06T 15/06* (2011.01)
*H01L 25/065* (2023.01)
*A63F 13/52* (2014.01)
*G06F 15/80* (2006.01)

(52) U.S. Cl.
CPC ......... *G06T 15/005* (2013.01); *A63F 13/52* (2014.09); *G06F 15/80* (2013.01); *G06T 15/06* (2013.01); *H01L 25/0652* (2013.01); *H01L 25/0655* (2013.01); *A63F 2300/203* (2013.01); *A63F 2300/209* (2013.01); *H01L 2224/16145* (2013.01); *H01L 2224/16227* (2013.01); *H01L 2224/17181* (2013.01); *H01L 2225/06513* (2013.01); *H01L 2225/06517* (2013.01); *H01L 2225/06541* (2013.01); *H01L 2225/1023* (2013.01); *H01L 2924/157* (2013.01); *H01L 2924/15192* (2013.01); *H01L 2924/15311* (2013.01)

(58) Field of Classification Search
None
See application file for complete search history.

(56) References Cited

U.S. PATENT DOCUMENTS 5,287,438 A * 2/1994 Kelleher .......... G06T 11/40
345/613
5,835,693 A * 11/1998 Lynch .............. B25J 9/1605
345/473

(Continued)

FOREIGN PATENT DOCUMENTS

EP   2 437 217 A2   4/2012
EP   3 556 444 A1   10/2019

(Continued)

OTHER PUBLICATIONS

Office Action dated Apr. 30, 2020, issued in U.S. Appl. No. 16/298,778, filed Mar. 11, 2019, 21 pages.

(Continued)

*Primary Examiner* — Jason A Pringle-Parker
(74) *Attorney, Agent, or Firm* — Dentons US LLP (57) ABSTRACT

An electronic chip and a chip assembly are described. The electronic chip comprises one or more processing cores and at least one hardware interface coupled to at least one of the one or more processing cores. At least one of the one or more processing cores implements a game engine in hardware.

14 Claims, 8 Drawing Sheets

Related U.S. Application Data (60) Provisional application No. 62/220,167, filed on Sep. 17, 2015, provisional application No. 62/219,593, filed on Sep. 16, 2015.

(56) References Cited

U.S. PATENT DOCUMENTS

| | | | |
|---|---|---|---|
| 6,348,919 B1* | 2/2002 | Murphy | G06T 15/005 345/589 |
| 6,570,564 B1 | 5/2003 | Sowizral et al. | |
| 6,816,750 B1 | 11/2004 | Klaas et al. | |
| 8,200,594 B1* | 6/2012 | Bleiweiss | A63F 13/67 706/45 |
| 9,443,192 B1 | 9/2016 | Cosic | |
| 2003/0058238 A1* | 3/2003 | Doak | G06T 19/00 709/217 |
| 2005/0086040 A1 | 4/2005 | Davis et al. | |
| 2005/0128203 A1 | 6/2005 | Huang et al. | |
| 2005/0195197 A1* | 9/2005 | Wolfe | G06T 11/40 345/505 |
| 2005/0215319 A1* | 9/2005 | Rigopulos | G06F 3/011 463/32 |
| 2006/0106591 A1 | 5/2006 | Bordes et al. | |
| 2006/0139358 A1 | 6/2006 | Cho et al. | |
| 2006/0232590 A1 | 10/2006 | Bakalash et al. | |
| 2006/0248543 A1 | 11/2006 | Jin et al. | |
| 2007/0154082 A1 | 7/2007 | Rhodes | |
| 2007/0155506 A1 | 7/2007 | Malik | |
| 2008/0059769 A1 | 3/2008 | Rymarczyk et al. | |
| 2009/0102844 A1 | 4/2009 | Deparis | |
| 2009/0197686 A1 | 8/2009 | Bergelt et al. | |
| 2009/0219285 A1* | 9/2009 | Reshetov | G06T 15/06 345/420 |
| 2010/0035637 A1 | 2/2010 | Varanasi et al. | |
| 2011/0167945 A1 | 7/2011 | Yang et al. | |
| 2011/0242427 A1 | 10/2011 | Ramsdale | |
| 2011/0321049 A1* | 12/2011 | Hickey | G06F 9/3879 712/42 |
| 2012/0069023 A1* | 3/2012 | Hur | G06T 15/005 345/426 |
| 2014/0161173 A1 | 6/2014 | Azar et al. | |
| 2014/0168236 A1 | 6/2014 | Keefe et al. | |
| 2015/0015253 A1 | 1/2015 | Mori et al. | |
| 2015/0106673 A1 | 4/2015 | Huang et al. | |
| 2015/0251092 A1 | 9/2015 | Chu et al. | |
| 2015/0255131 A1 | 9/2015 | Byeon et al. | |
| 2016/0093090 A1* | 3/2016 | Shin | G06T 17/005 345/419 |
| 2016/0117152 A1 | 4/2016 | Baker | |
| 2016/0314610 A1* | 10/2016 | Lee | G06T 15/06 |
| 2017/0011288 A1 | 1/2017 | Brothers et al. | |
| 2017/0010098 A1 | 6/2017 | Georgy et al. | |
| 2017/0243403 A1 | 8/2017 | Daniels et al. | |
| 2017/0323224 A1 | 11/2017 | Bruestle et al. | |
| 2018/0018590 A1 | 1/2018 | Szeto et al. | |
| 2018/0140942 A1 | 5/2018 | Miller et al. | |
| 2019/0205735 A1 | 7/2019 | Smelyanskiy et al. | |
| 2019/0287208 A1 | 7/2019 | Yerli | |
| 2019/0236606 A1 | 8/2019 | Padmanabhan et al. | |

FOREIGN PATENT DOCUMENTS

| | | |
|---|---|---|
| KR | 10-2010-0003518 A | 7/2011 |
| WO | 2014/105865 A1 | 7/2014 |
| WO | 2017/086922 A1 | 5/2017 |

OTHER PUBLICATIONS

Office Action dated Oct. 7, 2019, issued in U.S. Appl. No. 16/298,778, filed Mar. 11, 2019, 18 pages.

Almagbile, A.F.S., "GNSS/INS Integration for Positioning and Navigation: Modelling and Quality Analysis," Doctoral Dissertation, University of Jordan, Amman, Jordan, 2003, 217 pages.

Dupire, J., et al., "Using Game Engines for Non 3D Gaming Applications," Proceedings of the International Conference on Computer Games (CGAMES '05), Angouleme, France, Jan. 2005, pp. 304-307.

Extended European Search Report, dated Sep. 25, 2019, issued in European Application No. 19163040.9, filed Mar. 15, 2019, 10 pages.

"Game Engine," Wikipedia, The Free Encyclopedia, Mar. 10, 2018, <https://en.wikipedia.org/w/index.php?title=Game_engine&oldid= 829745391> [retrieved Dec. 9, 2019], 8 pages.

Lucas-Sabola, V., et al., "GNSS IoT Positioning: From Conventional Sensors to a Cloud-Based Solution," IG Inside GNSS, Jun. 15, 2018, <https://insidegnss.com/gnss-iot-positioning-from-conventional-sensors-to-a-cloud-based-solution/> [retrieved Feb. 11, 2019], 33 pages.

An In-Depth Look at Google's First Tensor Processing Unit (TPU), from <cloud.google.com/blog/products/gcp/an-in-depth-look-at-googles-first-tensor-processing-unit-tpu> [retrieved Sep. 16, 2019], 16 pages.

Jouppi, N.P., et al., "In-Datacenter Performance Analysis of a Tensor Processing Unit™," Proceedings of the 44th International Symposium on Computer Architecture (ISCA), Toronto, Canada, Jun. 26, 2017, 17 pages.

Van Lent, M., and J.E. Laird, "Developing an Artificial Intelligence Engine," Proceedings of the Game Developers Conference, San Jose, Calif., Mar. 16-18, 1999, 12 pages.

Yin, L., et al., "A GNSS-5G Integrated Positioning Methodology in D2D Communication Networks," IEEE Journal on Selected Areas in Communications 36(2):351-362, Feb. 2018.

Extended European Search Report dated Oct. 23, 2020, issued in European Application No. EP 20180743.5, filed Jun. 18, 2020, 9 pages.

"Challenges in GNSS/INS Integration," Thought Leadership Series, articles sponsored by NovAtel Inc., Feb. 11, 2012, 2 pages.

Skog, I., "Sensor Fusion GPS+IMU," Module 1—Sensing and Perception, 2016, 9 pages.

Usman, M., et al., "Technologies and Solutions for Location-Based Services in Smart Cities: Past, Present, and Future," IEEE Access, vol. 6, 2018, pp. 22240-22248.

Office Action dated Mar. 31, 2021, issued in U.S. Appl. No. 16/298,778, filed Mar. 11, 2019, 25 pages.

Office Action dated May 12, 2021, issued in U.S. Appl. No. 16/904,033, filed Jun. 20, 2020, 56 pages.

Office Action dated Feb. 8, 2021, issued in Chinese Application No. 201680053259.X, (Chinese version) 10 pages.

Office Action dated May 14, 2021, issued in Chinese Application No. 201680053259.X, (Chinese version) 11 pages.

Office Action dated Aug. 21, 2020, issued in Chinese Application No. 201680053259.X, (Chinese version) 11 pages.

International Search Report and Written Opinion, dated Jan. 3, 2017, issued in International Application No. PCT/EP2016/072018, filed Sep. 16, 2016, 25 pages.

"Game Engine," Wikipedia, The Free Encyclopedia, Mar. 20, 2013, <https://en.wikipedia.org/w/index.php?title=Game_engine&oldid= 545815894> [retrieved Jun. 4, 2014], 8 pages.

Barbic, J., "Multi-Core Architectures," May 3, 2007, https://www.cs.cmu.edu/~fp/courses/15213-s07/lectures/27-multicore.pdf [retrieved Sep. 27, 2019], 67 pages.

Office Action dated Nov. 4, 2021, in corresponding European application No. 16 775 106.4, 8 pages.

Office Action dated Nov. 8, 2021, in European application No. 19 163 040.9, 7 pages.

Interactive Indirect Illumination Using Voxel Cone Tracing Accepted at Pacific Graphics 2011 vol. 30 (2011), No. 7 http://maverick.inria.fr/Publications/2011 /CNSGE11 b/GIVoxels-pg2011-authors.pdf. https://pdfs.semanticscholar.org/57ec/ b354cdcde1a611cc3b0c3644c5c07661df22.pdf The Ray Engine by nathan Carr et al Graphics hardware (2002) pp. 1-10.

\* cited by examiner

GAME ENGINE ON A CHIP

CROSS-REFERENCES TO RELATED APPLICATIONS

This application is a continuation of U.S. application Ser. No. 15/047,556, filed Feb. 18, 2016, which claims the benefit of Provisional Application No. 62/220,167, filed Sep. 17, 2015, and Provisional Application No. 62/219,593, filed Sep. 16, 2015, the disclosures of which are hereby incorporated by reference herein.

TECHNICAL FIELD

The present disclosure relates to an electronic chip or chip assembly. In particular, the present disclosure relates to a game engine implemented on an electronic chip or chip assembly in hardware. The present disclosure may also relate to a system on chip or system in package.

BACKGROUND

Game engines play an increasingly important role in graphics applications. One major task of a software game engine is to provide the most realistic and highest quality of graphics possible at a real-time performance. A software game engine is typically provided as computer-executable code that is executed on a central processing unit (CPU). For example, the game engine may typically run on a processor or microprocessor of a computing device, such as a CPU of a personal computer, a console, a mobile phone or a tablet. Hence, performance of the CPU may determine the performance of a software game engine.

The software game engine may also access a graphics processing unit (GPU). For example, the GPU can render lists of individual objects with a very high performance to graphics memory or video memory. A computer graphics scene may include a large number of objects with characteristics related to their position and orientation, behavior, material properties and the like. In order to achieve highly realistic scenes, the game engine needs to consider the whole scene, which may often contain millions of objects that are to be rendered to the screen. For example, the game engine may consider the behavior and interaction of light with individual objects and between the objects of the scene.

Further to the complexity of computer graphics scenes, the resolution of displays is rapidly increasing. Standards include Full HD with 1,920 by 1,080 pixels, Ultra HD with 3,840 by 2,160 pixels and others. This trend is expected to continue. For example, virtual reality head-mounted displays are currently under development for the consumer market with a horizontal resolution of more than 10,000 pixels. The result is an explosive growth in the performance needed.

In order to achieve real-time rendering goals and to keep up with the increasing requirements, the software game engine may balance a hardly noticeable loss of quality with improved performance. One way of doing so is by dividing individual tasks into sub-tasks, specifically those which can be performed efficiently on a GPU. Graphics tasks could be parallelized on multiple CPUs. Currently, the typical number of CPUs per personal computer is just two and the typical number of GPU is only one; numbers which have not been growing in the recent years. Graphics software thus cannot rely on a sufficient number of CPUs and/or GPUs. Furthermore, even if there are many CPUs available, a multi-CPU subsystem is often too energy-inefficient for a specific task. Hence, even a parallel execution could be restricted by currently available hardware.

A parallel execution of tasks, however, also requires a complete redefinition of the software layer between the graphics software applications in general at one side and the GPU drivers at the other side. Examples of such redefined interface layers include programming interfaces, such as Mantle (available from Advanced Micro Devices, Inc. (AMD)), DirectX 12 (available from Microsoft Corporation), Metal (available from Apple Inc.) and Vulkan (available from The Khronos Group, Inc.), which have in common that they interact with the GPU at a much lower level for improved efficiency. However, there is a trade-off between an increase in efficiency and added complexity of the programming interfaces. Hence, it is expected that only a small number of experienced graphics programmers will actually use these new high-performance interfaces. For less demanding graphics software, the older, simpler interfaces are preferable.

Hence, it is an object of the present disclosure to provide graphics processing which meets the demands for complexity and efficiency.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The problem is solved by embodiments of an electronic chip and a chip assembly, as described herein.

A first aspect of the present disclosure is an electronic chip comprising one or more processing cores, and at least one hardware interface coupled to at least one of the one or more processing cores, wherein at least one of the one or more processing cores implements a game engine.

The verb "implement" as used throughout this application is directed at an implementation in hardware. Hence, a processing core may include a plurality of electronic circuits that are configured to realize functionality of a game engine. A processing core of the chip implementing a game engine should not be interpreted as a central processing unit being capable of executing instructions of a software game engine.

Rather, the processing core implementing the game engine is a dedicated electronic circuitry implementing or realizing the functionality of a game engine in hardware. Hence, the game engine may also be referred to as a hardware game engine or as a hardwired game engine or as an on-chip game engine. Accordingly, the electronic chip may be referred to as an Engine on Chip (EOC). The processing cores may implement the game engine as a plurality of hardwired electronic circuits implementing the functionality, which may be arranged or assembled according to any suitable production process. Furthermore, a configured field programmable gate array (FPGA) could be used to implement the game engine in hardware. The electronic chip may be provided as an integrated circuit that integrates all components and functionality of the hardwired game engine into a single chip or a plurality of chips.

The processing cores of the electronic chip may be regarded as functional units or modules of the electronic circuits of the electronic chip. For example, at least one of the one or more processing cores may be realized as an FPGA or any other form of an integrating circuit implementing a dedicated functionality. Accordingly, the electronic chip comprises at least one integrated circuit realizing at least some of the one or more processing cores, wherein at least one of the processing cores implements the hardwired game engine.

The at least one hardware interface enables a direct interaction with the one or more processing cores, such as with the hardwired game engine. The hardware interface may be realized as a part of the at least one integrated circuit of the electronic chip. However, the hardware interface may also be realized as one or more further integrated circuits providing the functionality of interfacing the processing cores, including the hardwired game engine.

The present disclosure provides a support for efficient, real-time, highly realistic rendering by implementing a game engine in hardware. The electronic chip may be used to support a CPU of a host system, such as a console or mobile device, by providing a dedicated 3D graphics hardware. However, since the graphics hardware implements a game engine, control of the hardware may be simplified since interfaces of the game engine may be used. Hence, an average graphics programmer that needs to write high-performance and highly realistic applications may use the hardwired game engine, which maintains a simple interface while providing the programmer with highly realistic real-time rendering options.

Preferably, the hardwired game engine may include a core that implements hardwired algorithms and code functions, which may be applied to data sets. This may enable faster graphics or simulation results in 2D, 3D or 4D (3D+time) even for stereo displays. The data sets processed by the game engine core may be fed into either a graphics processing unit or a central processing unit for further processing, which may be located on a chip or provided by the host system.

In an embodiment, at least one of the processing cores implements a ray trace engine (in hardware). The ray trace engine may also be regarded as a hardwired ray trace engine. Similar to the game engine, the ray trace engine may be realized in hardware by one or more dedicated electronic circuits, such as integrated circuits, one or more FPGAs and the like, to implement ray tracing functionality.

In a further embodiment, the game engine is coupled to the ray trace engine, the ray trace engine being configured to augment functionality of the game engine. The ray trace engine may be a specialized ray trace engine for the game engine. Ray tracing tasks of the game engine may be offloaded by the game engine to the ray trace engine. However, a plurality of game engines implemented on the chip may also share a single or multiple ray trace engines, wherein the plurality of game engines may offload their ray tracing tasks to the shared ray trace engines. The game engine and the ray trace engine may be coupled with each other directly or using a plurality of buffers, such as a dedicated memory and/or a dedicated command channel, wherein the game engine may write data to the dedicated memory and issue a command via the command channel to trigger processing of the ray trace engine. By directly coupling the game engine and the ray trace engine using dedicated components, the data exchange speed and throughput can be greatly improved and optimized since data exchange can be carried out via short data links and no complex data exchange protocol needs to be implemented.

In yet another embodiment, a plurality of the processing cores implement a plurality of game engines and a plurality of ray trace engines, wherein each of the plurality of game engines is associated with a single one or at least one of the plurality of ray trace engines. Preferably, the associated ray trace engine is a specialized ray trace engine for the respective game engine. Hence, each game engine may have a specialized ray trace engine to offload respective ray tracing tasks to the ray trace engine. A specialized ray trace engine as used throughout this disclosure supports a variety of algorithms that are normally not supported by a ray trace engine. For example, a specialized ray trace engine may enable voxel space based cone tracing for global illumination. Additionally or as an alternative, a specialized ray trace engine may support G-buffer based tracing algorithms like, for instance, screen space reflection mapping and parallax occlusion mapping. Hence, the algorithms may be supported by the specialized ray trace engine instead of the game engine itself.

In yet another embodiment, at least one of the processing cores implements a central processing unit. Hence, the at least one processing core may be an electronic circuitry that carries out instructions of a computer program by performing basic arithmetic, logical, control and input/output (I/O) operations. The functionality of the central processing unit may be the same or similar to existing CPUs. The central processing unit may allow an execution of software according to an instruction set architecture directly on the electronic chip. The software may be dedicated to processing of the game engine. However, it is to be understood that the central processing unit is not restrictive to processing of the game engine only but may, rather, execute any kind of software which may exploit the functionality of the electronic chip. The electronic circuitry may include at least one respective microcontroller, microprocessor or digital signal processor (DSP) on the single electronic chip in any combination. In order to enable operation of the central processing unit, the electronic chip may further comprise memory blocks, such as a selection of ROM, RAM, EEPROM and/or flash memory, timing sources including oscillators and phase-locked loops, peripherals including counter timers, real-time timers and power-on reset generators, external interfaces, such as USB, Firewire, Ethernet, SPI, and the like, analog interfaces including ADCs and DACs, voltage regulators and power management circuits on the electronic chip, in any combination. Some of these components may form part of the electronic circuitry realizing the at least one processing core implementing the central processing unit while others may be separate and dedicated components of the electronic chip that are realized by one or more electronic circuits implementing the desired functionality. The game engine may be directly coupled to the central processing unit and/or may utilize a buffer or memory to exchange data between the central processing unit and the game engine. The central processing unit may also include further interfaces to directly couple to the hardwired game engine. By coupling the game engine and the central processing unit using dedicated data links and/or buffers, the data exchange speed and throughput can be greatly improved and optimized since data exchange can be carried out via short data links and no complex data exchange protocol needs to be implemented.

In a further embodiment, a plurality of the processing cores implement a plurality of central processing units, each central processing unit being configured to execute instructions of a different instruction set architecture. Hence, the electronic chip may execute software on the individual central processing units, which may be compiled for different systems, including but not limited to Intel's x86 architecture as commonly used in personal computer systems, and systems based on the ARM instruction set, which is typically used in mobile phones and tablets. Hence, the electronic chip may be used in a heterogeneous environment providing a unified access to a well-defined game engine interface for a broad range of software, without requiring an adaptation of the software to a particular instruction set architecture.

According to one embodiment, the game engine is configured to communicate data via the hardware interface with an external GPU. The game engine may receive data from an external entity, such as a CPU or GPU, via the hardware interface. The game engine may send processed data via the hardware interface to the external entity or another external entity. Preferably, the hardware interface may be a bus interface or an external interface. The processed data may be supplied to the external GPU for further processing and/or rendering on a target display.

In yet another embodiment, at least one of the processing cores implements a graphics processing unit (in hardware). Hence, the graphics processing unit can be regarded as a hardwired graphics processing unit on the electronic chip. The at least one hardware interface may include a media interface, such as HDMI and the like, which may provide data rendered by the on-chip graphics processing unit to a display or screen. However, it is to be understood that the graphics processing unit may also interface, via the hardware interface, with a bus or other interconnect of a host system to provide the rendered data for display.

In yet another embodiment, the game engine is configured to generate data for the graphics processing unit. The game engine may pre-process input data that may be suitable for processing on the specialized hardware of the graphics processing unit, which may include SIMD processing or vector processing as is known in the art. The preprocessed data may be provided to the on-chip graphics processing unit, which may further process the data and/or generate a final rendering of the graphics scene based on the preprocessed data. The graphics processing unit may also provide the results to the game engine for further processing. Hence, the game engine may prepare data or data sets and offload specific tasks to the graphics processing unit in order to exploit the GPU functionality or the specialized hardware of the GPU.

According to one embodiment, the electronic chip may comprise a memory, wherein the game engine is configured to provide the data to the graphics processing unit via the memory. For example, the game engine may store the preprocessed data in the memory and may issue a command to the on-chip graphics processing unit to read and further process the data. The on-chip graphics processing unit may use the memory or a different communication channel to communicate the results to the hardwired game engine. A register or a register set may be used to control properties of the memory, to indicate characteristics of the stored data and/or to control operation of the on-chip graphics processing unit.

In yet another embodiment, the graphics processing unit is connected to a video memory and the game engine is configured to provide data to the graphics processing unit via the video memory. The on-chip graphics processing unit may be connected to a dedicated video memory, which may be used internally by the graphics processing unit to load, store or buffer data during processing of the graphics processing unit. The video memory may be located on an interposer as a stack of memory chips. The video memory may be further coupled, for example, via the at least one hardware interface, to the at least one processing core implementing the game engine, thereby enabling the game engine to directly load and store data to the video memory. This may further improve speed and throughput of data exchange between the hardwired game engine and the on-chip graphics processing unit without departing from a standard design of the graphics processing unit. This may simplify the design and fabrication of the chip.

In yet another embodiment, the game engine is configured to perform one or more tasks, thereby generating commands and/or data sets. Preferably, the generated commands and/or data sets are to be processed by a graphics processing unit, such as the on-chip graphics processing unit or an external GPU. The one or more tasks may be defined by and reflect the functionality of the game engine. The electronic chip may expose an interface for controlling the game engine according to its functionality. Preferably, the one or more tasks may be reflected in a programming interface exposed by the game engine via the hardware interface.

Preferably, the game engine and the ray trace engine are interoperably coupled to perform the one or more tasks. Hence, the ray trace engine or a specialized ray trace engine of the game engine may alter the functionality of the game engine such that a set of the tasks or sub-tasks may be offloaded to and transparently processed by the ray trace engine instead of the on-chip game engine. The game engine may interoperate with its associated ray trace engines to generate commands and/or data sets that may be provided to a graphics processing unit, such as the on-chip graphics processing unit or an external GPU for further processing, such as a final rendering, or for generation of further auxiliary data which may be provided back to the game engine for further processing. This is advantageous, since the functionality of the electronic chip may be controlled via the game engine interface without requiring any control of an underlying ray trace engine(s) or graphics processing unit(s). By exploiting the hardware capabilities of dedicated ray trace engines and graphics processing units on the electronic chip, performance of the electronic chip is further improved.

In yet another embodiment, the one or more tasks include one or more of determining how objects cast shadows over other objects, determining how objects are reflected in other objects, or determining how the light falling on one object illuminates other surrounding objects. The one or more tasks may be initiated via an interface of the on-chip game engine and potentially offloaded to other components of the chip or external components, such as the on-chip central processing unit(s), the on-chip graphics processing unit(s), the on-chip ray trace engine(s), external CPU(s) and/or external GPU(s), in any combination. In addition or as an alternative, the game engine may perform other and further tasks, including tasks directed at simulation and/or rendering of graphics scenes, such as a simulation of individual objects of the graphics scene, a determination of characteristics of objects of the graphics scene, rendering of one or more of the objects of the graphics scene, and the like. In addition or as an alternative, the game engine may perform one or more of viewport culling and coverage (z-) buffer culling to determine visibility of objects, voxelization of a scene as a preparation step for global illumination calculations, sparse voxel-based cone tracing for global illumination, muscle fiber mechanics and musculoskeletal skinning, finite element methods for biomechanical muscle modelling, fluid dynamics using SPH (smoothed-particle hydrodynamics) for realistic effects involving water volumes, volcanic lava volumes, and astrophysical effects, which may be related to surfaces of stars, real-time Eulerian water simulation, or realistic vegetation dynamics, and the like, in any combination.

According to one embodiment, the chip is a system on chip (SOC). The SOC may be a game engine processor chip or a graphics processor chip. Hence, the electronic chip can be regarded as an integrated circuit that integrates all components of a game engine or even of a graphics sub-system into a single chip. The chip may also be referred to as an Engine on Chip (EOC). The integration of the electronic chip on a single chip allows for low power consumption while providing a high graphics performance.

According to a further aspect, a chip assembly is provided that comprises at least one chip according to embodiments of the present disclosure. The chip may preferably comprise one or more processing cores and at least one hardware interface coupled to at least one of the one or more processing cores, wherein at least one of the one or more processing cores implements a game engine. The chip assembly may comprise a silicon interposer or carrier, board or substrate to mount the at least one chip and other components of the chip assembly.

As used throughout this disclosure, a chip can be regarded as a layer of transistors, which may further comprise on top of the layer of transistors a plurality of layers of metal interconnects. The layer of transistors may be difficult to produce, in particular for very small transistors. Furthermore, a first layer of the metal interconnect, which may include very fine metal wires, may also be hard to produce. A skilled person would understand that a majority of failures may occur in the production of these layers. The upper layers may have thicker wires and are, in comparison, more easy to produce and may seldom cause production failures. Hence, they may be used to connect major areas of the chip together.

A (silicon) interposer as used throughout this disclosure may be a generally very large chip with only upper layers of interconnects that may use thicker wires. Hence, the (silicon) interposer can be designed and produced cheaper with existing chip fabrication equipment. Although the wires may be relatively thick, a (silicon) interposer may include tens of thousands of wires.

A chip assembly as used throughout this disclosure may refer to a combination of a plurality of (sub-)chips on one silicon interposer. Hence, a chip assembly may be functionally equivalent to a single chip that may be very big. This is particularly advantageous if during production or fabrication, a single chip would become very big and therefore too costly to produce, for example due to higher defect rates. Accordingly, the design of the single chip could be subdivided into multiple separate (sub-)chips, which can be smaller. The smaller chips can be tested first and those that pass the test can then be connected together on a silicon interposer in the chip assembly. Furthermore, a whole range of designs can be made of different sizes, such as medium, large, very large and huge, at little extra costs, by placing several equal small chips on a medium, large, very large or huge silicon interposer. Accordingly, the at least one chip of the chip assembly according to embodiments of the present disclosure may be subdivided into multiple separate smaller (sub-)chips that are connected together on the silicon interposer or carrier of the chip assembly.

A silicon interposer can be used to establish tens of thousands of connections between multiple chips on the chip assembly. It is to be understood that the silicon interposer may establish significantly more interconnects than provided by a carrier, board or substrate to mount the at least one chip. A silicon interposer may cover an entire area of all (sub-)chips that are interconnected by the silicon interposer.

In yet another embodiment, a chip assembly may be interconnected using micro-bridges comprising the interconnect layers. Micro-bridges may only cover edges of adjacent (sub-)chips providing the interconnections between these adjacent (sub-)chips.

In one embodiment, the chip assembly may further comprise at least one central processing unit, wherein the central processing unit is connected to the hardware interface of the chip. The central processing unit may be connected to the hardware interface via a bus or any other suitable interface or interconnect of the chip assembly.

In yet another embodiment, the chip assembly may further comprise at least one graphics processing unit, wherein the at least one graphics processing unit is connected to the hardware interface of the chip.

In yet another embodiment, the chip assembly further comprises a memory controller configured to exchange data with the game engine of the chip.

Hence, the chip assembly may integrate the electronic chip implementing the hardwired game engine and further comprise one or more dedicated components, including a central processing unit, the graphics processing unit and/or a memory controller that may form part of the chip assembly but which may be off-chip with regard to the chip implementing the hardwired game engine. These components may be, however, distinct from components of a host system and components of the electronic chip implementing the hardwired game engine, such as on-chip central processing unit(s), on-chip graphics processing unit(s) and/or an on-chip memory controller. By using an off-chip implementation and integration of these components in the chip assembly, standard components for the central processing unit, the graphics processing unit and the memory controller may be used, which may simplify design, processing and fabrication of the chip assembly and reduce respective costs. The chip assembly and its components may be arranged on a carrier, board or substrate that may include an interconnect for the individual components of the chip assembly.

In one embodiment, the chip assembly may include a plurality of stacked integrated circuits, wherein an integrated circuit is stacked on top of another integrated circuit or on an interposer chip. The (vertically) stacked integrated circuits may be connected by Through Silicon Vias (TSV). TSVs are vertical electrical connections passing through a silicon wafer or die. Alternatively the (vertically) stacked integrated circuits may be connected using inductive coupling technology to enable near field wireless communication between the (vertically) stacked integrated circuits. The integrated circuits may realize or implement in hardware one or more of the electronic chip, including the one or more processing cores implementing the hardwired game engine, the central processing unit, the graphics processing unit, the memory controller and further components and interfaces of the chip assembly, in any combination. A stacked design may be regarded as a variation of the interposer.

It should be noted that the use of the term silicon in "Silicon Interposer" or "Through Silicon Via" merely stems from the fact that silicon is a dominant material used as a wafer substrate in chip production. However, it is to be understood that embodiments of the present disclosure are not restricted to a particular material. Other materials suitable for application in embodiments of the present disclosure include Germanium, Gallium Arsenide, Indium Arsenide, and the like, in any combination. Accordingly, a respective interposer or through via may be used in corresponding embodiments.

In one embodiment, the chip assembly may be included in a package. Preferably, the chip assembly can be included in a graphics processor package or a game engine processor package. Preferably, the chip assembly may be included in a system in package (SiP) or a package on package. The package including the chip assembly may be easily integrated into a great variety of target environments in order to enable a high performance and realistic rendering of computer graphics.

In a system in package (SiP), a number of integrated circuits may be enclosed in a single module (package). The SiP performs all or most of the functions of an electronic system, and may be used for mobile phones, digital media players, and the like. Dies containing the integrated circuits may be stacked vertically on a substrate, carrier or board. They may be internally connected by wires that may be bonded to the package. Alternatively, a flip chip technology may be applied, where solder bumps are used to join stacked chips together. SiP dies can be stacked vertically or tiled horizontally to produce a dense multi-chip package. SiP can connect the dies with standard off-chip wire bonds or solder bumps, or may at least partially use a technology similar to three-dimensional integrated circuits which connect stacked silicon dies with conductors running through the die. The SiP can include one or more of specialized processors, DRAM, flash memory, and other active components, which may be combined with passive components, such as resistors and capacitors that may be all mounted on the same board, carrier or substrate. The SiP represents a complete functional unit that can be built in a multi-chip package without further external components. This is advantageous in space-constrained environments, like mobile devices. The complexity of the printed circuit board and overall design may be greatly reduced.

According to yet another aspect, a computing device is provided, which includes at least one chip or chip assembly according to embodiments of the present disclosure, and a display configured to display data based on data provided by the at least one chip or chip assembly.

In one embodiment, the computing device is a mobile device, a smartphone, or a virtual reality device.

According to yet another aspect, a method for providing an electronic chip for graphics processing is defined. The method includes providing an electronic chip comprising one or more processing cores and at least one hardware interface coupled to at least one of the one or more processing cores, and implementing in hardware a game engine by at least one of the one or more processing cores.

According to one embodiment, the method may further comprise providing the electronic chip on a chip assembly.

Hence, according to described embodiments, the electronic chip providing a hardwired functionality for high performance and efficient computer graphics may be provided as a system on chip, including, but not limited to a game engine processor chip or a graphics processor chip, or as a package, including, but not limited to a graphics processor package or a game engine processor package.

According to yet another aspect, a computer-readable medium is provided, wherein the computer-readable medium stores instructions thereon that, when installed on and executed by a computing device, cause the computing device to perform a method according to one embodiment of the present disclosure. Preferably, the method may include a fabrication of an electronic chip and/or an operation of the electronic chip according to embodiments of the present disclosure.

BRIEF DESCRIPTION OF THE DRAWINGS

Specific features, aspects and advantages of the present disclosure will be better understood with regard to the following description and accompanying drawings, where.

DETAILED DESCRIPTION

In the following description, reference is made to drawings which show by way of illustration various embodiments. Also, various embodiments will be described below by referring to several examples. It is to be understood that the embodiments may include changes in design and structure without departing from the scope of the claimed subject matter.

Figure 1:
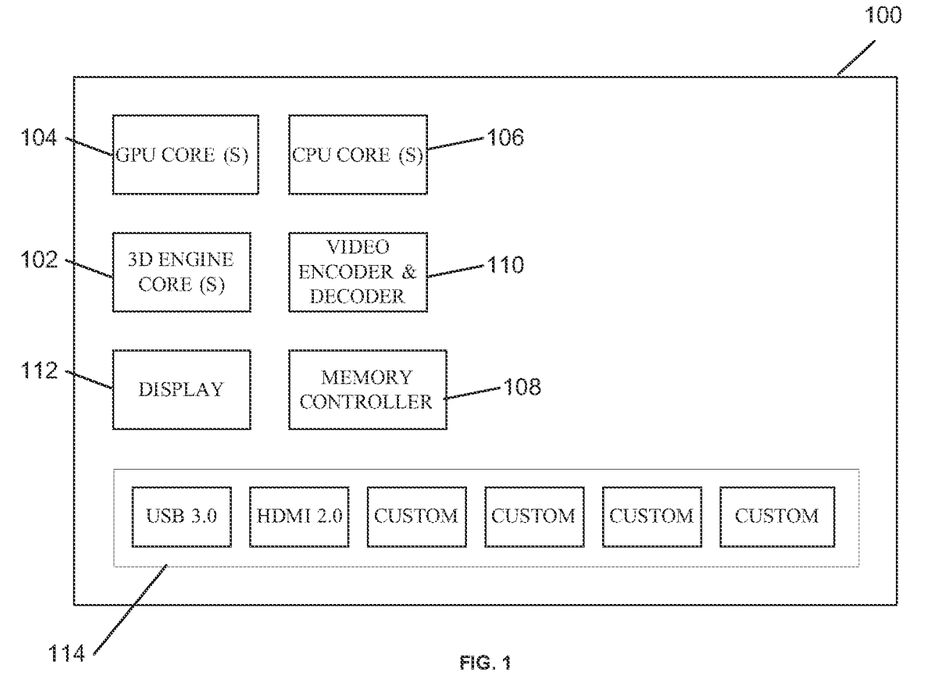
FIG. 1 illustrates a schematic view of an electronic chip including one or more hardwired game engines according to one embodiment of the present disclosure.

FIG. 1 shows an electronic chip according to one embodiment of the present disclosure. The electronic chip may include a single or a plurality of hardwired game engines that may be physically incorporated on the chip, which may, therefore, represent a system on chip (SOC).

The chip 100 may comprise a plurality of processing cores, each implementing in hardware a (hardwired) game engine 102, a graphics processing unit (GPU) 104, and a central processing unit (CPU) 106. Even though each core is shown as implementing in hardware a dedicated component, it is to be understood that a plurality of processing cores may implement one component or that one processing core may implement a plurality of components, such as the game engine 102, the GPU 104, and the CPU 106, in any combination. The chip 100 may comprise a plurality of game engines, a plurality of GPUs and a plurality of CPUs, in any number and combination.

The chip 100 may be included in a host system (not shown) as a SOC. The hardwired game engine 102 can directly process specifically constructed data sets located either in an external main memory of the host system, which may be accessible via one or more ports of an on-chip memory controller 108 and/or which may be located in a specifically designated memory area (not shown) on the chip 100 itself.

The hardwired game engine 102 may be able to determine, for instance, but not limited to, how objects cast shadows over other objects of a computer graphics scene, how objects are reflected in other objects or how the light falling on one object illuminates other surrounding objects. However, it is to be understood that the game engine 102 may be configured to perform other tasks and/or may provide other functionality, such as management, simulation and rendering of the objects of the computer graphics scene.

The hardwired game engine 102 may have the GPU 104 on the chip 100 to its disposal. The hardwired game engine 102 can generate data sets specifically designated to be handled over to the GPU 104 on the chip 100. The hardwired game engine 102 can place these data sets in the external memory of the chip 100 via one or more ports of the on-chip memory controller 108 and/or place the data sets in a specifically designated memory area on the chip 100 itself. The hardwired game engine 102 may have means to command the GPU 104 on the chip 100 to process the data sets generated by the hardwired game engine 102, such as one or more of buffers, command channels and/or registers, either via a direct connection to the GPU 104 and/or indirectly via a connection to the CPU 106 on the chip 100. In the latter case, the CPU 106 on the chip 100 may be configured to instruct the GPU 104 to operate on the data sets generated by the hardwired game engine 102.

As shown in FIG. 1, the chip 100 may comprise a further video encoder and decoder 110, a display 112, and a hardware interface 114. The video encoder and decoder 110 may perform various dedicated functionality directed at encoding and decoding of video sequences. The display 112 may either be a display configured to display at least some of the output of the GPU 104 or may be configured to display a state of the chip 100, by, for example, using a plurality of status indicators. Furthermore, the display 112 may also be configured as an interface to provide data to an external display (not shown). The hardware interface 114 may comprise or represent one or more interfaces, which may be configured to provide data for individual components of the chip 100, such as the game engine 102, the GPU 104, the CPU 106, the video encoder and decoder 110, and/or to output data generated by the individual components, such as data generated by the game engine 102, the GPU 104 or the CPU 106. The hardware interface may be configured to comply with one or more standards, such as USB, HDMI and the like.

Figure 2:
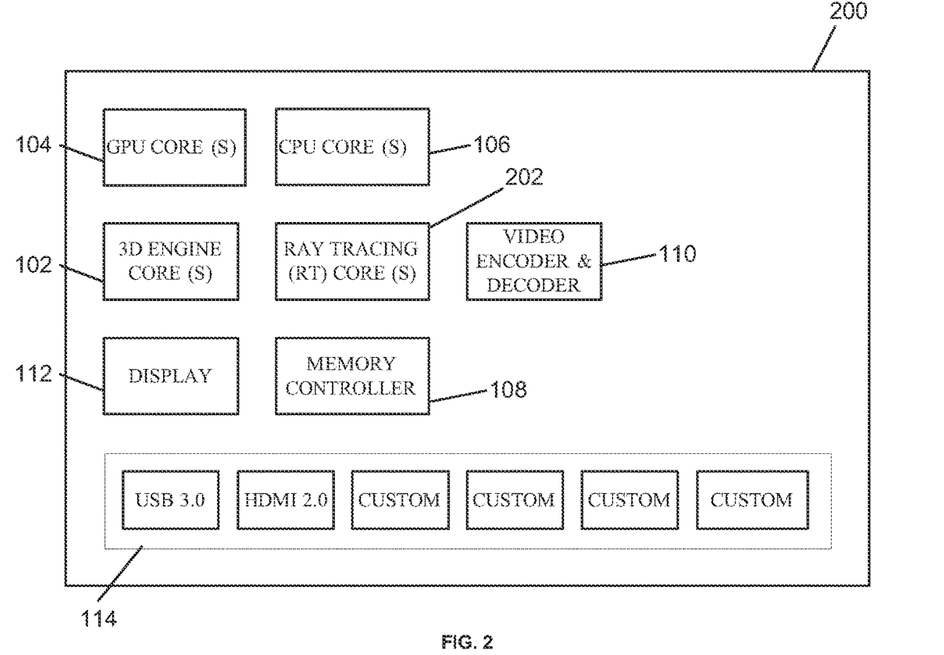
FIG. 2 shows a schematic view of an electronic chip including a plurality of hardwired game engines and ray trace engines according to one embodiment of the present disclosure.

FIG. 2 shows another embodiment of a chip according to the present disclosure. The chip 200 may be similar to the chip 100 of FIG. 1. Therefore, the same reference signs as used in FIG. 1 have been used in FIG. 2.

The chip 200 may comprise one or more of a game engine 102, a GPU 104, a CPU 106, a memory controller 108, a video encoder and decoder 110, a display 112, and a hardware interface 114. The chip 200 may also comprise a plurality of game engines 102, a plurality of GPUs 104, and a plurality of CPUs 106, in any combination, which may be implemented in hardware by at least one or respective processing core of the chip 200.

The single or the plurality of hardwired game engines 102 may be physically incorporated on the chip 200 to thereby form a SOC. The single or the plurality of hardwired game engines 102 may be incorporated on the SOC together with a single or a plurality of ray trace engines 202. The one or more ray trace engines 202 may be implemented by at least one processing core of the chip 200 and may be configured in such a way that the functionality of the one or more game engines 102 is augmented. As will be acknowledged by those skilled in the art, the typical functionality of a ray trace engine is known. The functionality may, for example, include viewport culling and coverage (z)-buffer culling to determine visibility of objects; voxelization of a scene as a preparation step for global illumination calculation; sparse voxel-based cone tracing for global illumination; muscle fiber mechanics and musculoskeletal skinning, finite element methods for biomechanical muscle modelling; fluid dynamics using SPH (smoothed-particle hydrodynamics) for realistic effects involving water volumes, volcanic lava volumes, and astrophysical effects related to, for example, surfaces of stars; real-time Eulerian water simulation; and/or realistic vegetation dynamics, in any combination. The one or more ray trace engines 202 may be used to augment the functionality of the hardwired game engine 102. For example the hardwired game engines 102 may transparently offload processing tasks to the ray trace engines 202. It is to be understood that the one or more ray trace engines 202 may perform certain tasks better and/or faster due to their specialization for given time restrictions.

The ray trace engines 202 may be assigned to individual game engines 102 according to a workload of the game engines 102 or according to a predefined assignment. The assignment may be controlled by the game engines 102 or by the CPU 106 in accordance with internal conditions or responsive to commands received via the hardware interface 114 to the chip 200.

Figure 2A:
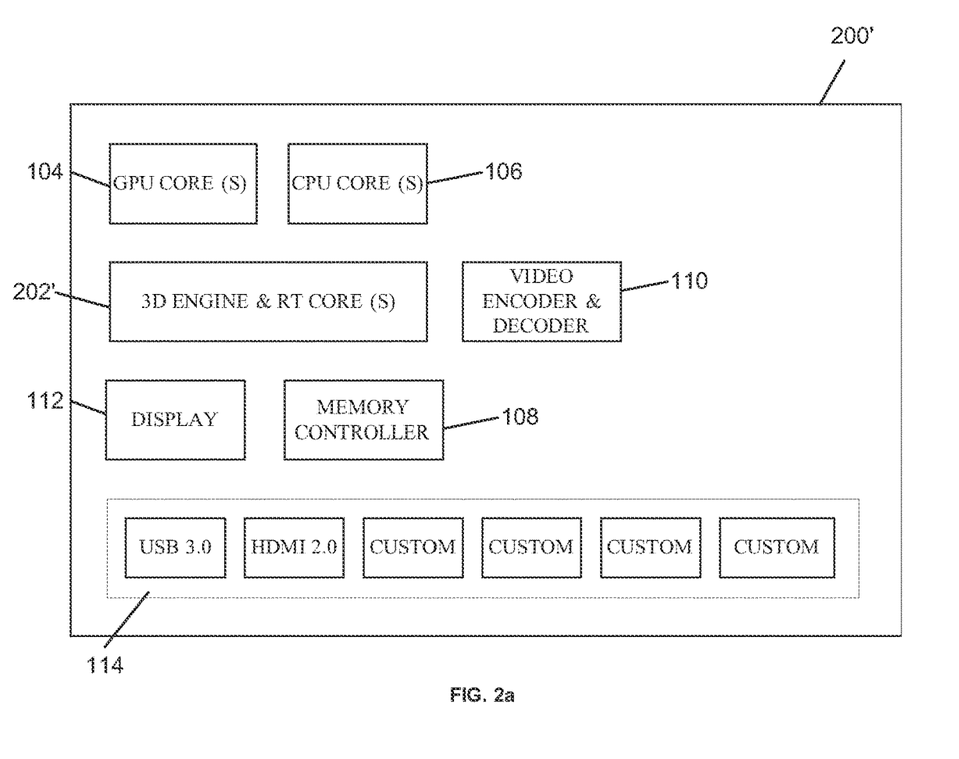
FIG. 2a shows a schematic view of an electronic chip, wherein each hardwired game engine incorporates its own specialized ray trace engine, according to one embodiment of the present disclosure.

FIG. 2a shows yet another embodiment of a chip according to the present disclosure, wherein each hardwired game engine may incorporate its own specialized ray trace engine. The chip 200' may include the same or similar parts as disclosed with regard to chips 100 and 200 in FIGS. 1 and 2. Therefore, the same reference signs have been used to denote similar parts. The chip 200' may include one or more GPUs 104, one or more CPUs 106, a memory controller 108, a video encoder and decoder 110, a display 112 and a hardware interface 114, in any combination. The individual components may be implemented by at least one processing core of the chip 200'.

Chip 200' further includes a combined game engine 202' having an incorporated specialized version of a ray trace engine. The specialized version of the ray trace engine may be specifically optimized for the requirements of the functionality of the hardwired game engine 202'. The ray trace engine may be hardwired with the game engine to thereby optimize the data exchange, in terms of bandwidth and latency, between the game engine and the ray trace engine using internal communication buffers or by directly transmitting data from the game engine to the integrated ray trace engine.

Figure 3:
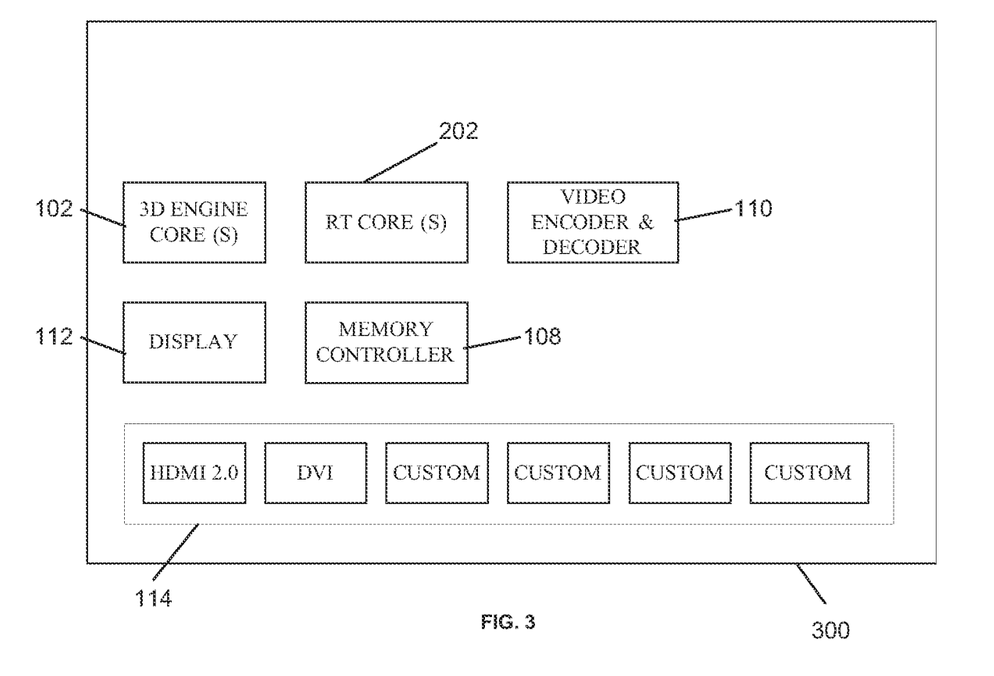
FIG. 3 shows a schematic view of a game engine processor according to one embodiment of the present disclosure.

FIG. 3 shows a game engine processor including a chip according to one embodiment of the present disclosure. The game engine processor 300 may include components similar to the components of chips 100, 200, and 200' as shown in FIG. 1, FIG. 2, and FIG. 2a. Hence, same or similar parts have been denoted using the same reference signs.

The game engine processor 300 may include one or more game engines 102, one or more ray trace cores 202, a memory controller 108, a video encoder and decoder 110, a display 112, and a hardware interface 114. The processor 300 may be realized in hardware as a game engine processor chip or a game engine processor package, where the package may contain a single or a plurality of integrated circuits implementing in hardware the functionality of the individual components. The hardwired game engine 102 may be incorporated into a hardware component, such as processor 300 that may be a stand-alone game engine processor chip or a game engine processor package. The game engine processor may be particularly useful in the case of high end 3D graphics or gaming computers. These computer systems typically contain separate host CPUs together with separate 3D graphics cards with one or more GPUs. The stand-alone game engine processor 300 could, for instance, be placed in a 3D graphics card together with one or more GPUs, but is not so limited.

The game engine processor 300 may include additional means to communicate data sets related to the functionality of the hardwired game engine 102 to and from external GPUs, for example, by using the GPUs on-chip DMA (Direct Memory Access) facilities, which may allow access to and from the GPU's video memory. The additional means may be implemented using the hardware interface 114 or using another communication controller (not shown).

Figure 4:
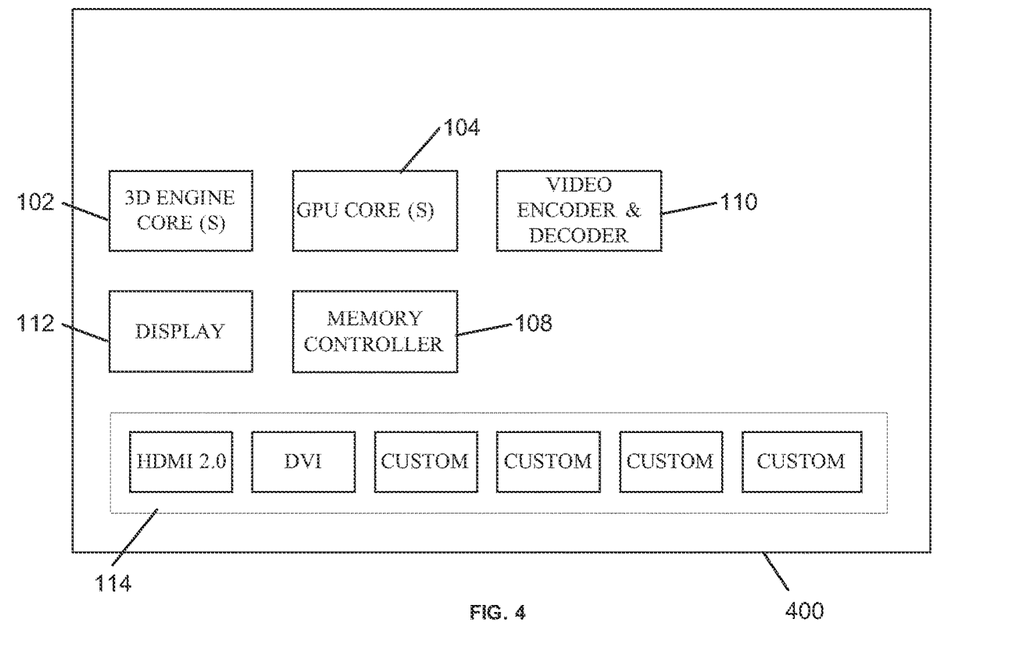
FIG. 4 shows a schematic view of a stand-alone discrete graphics processor according to one embodiment of the present disclosure.

FIG. 4 shows a graphics processor including a chip or chip assembly according to one embodiment of the present disclosure. The graphics processor 400 may include similar components as discussed with regard to FIGS. 1 to 3. Hence, same or similar components have been denoted using the same reference signs.

The graphics processor 400 may include at least one of one or more game engines 102, one or more GPUs 104, a memory controller 108, a video encoder and decoder 110, a display 112, and a hardware interface 114, in any combination. The one or more hardwired game engines 102 may also be physically incorporated together with one or more ray trace engines (not shown) configured to augment the game engine functionality in the graphics processor 400. The graphics processor 400 may be embodied as a stand-alone "discrete" graphics processor chip or a stand-alone discrete graphics processor package, where the package may contain one or more integrated circuits.

Figure 4A:
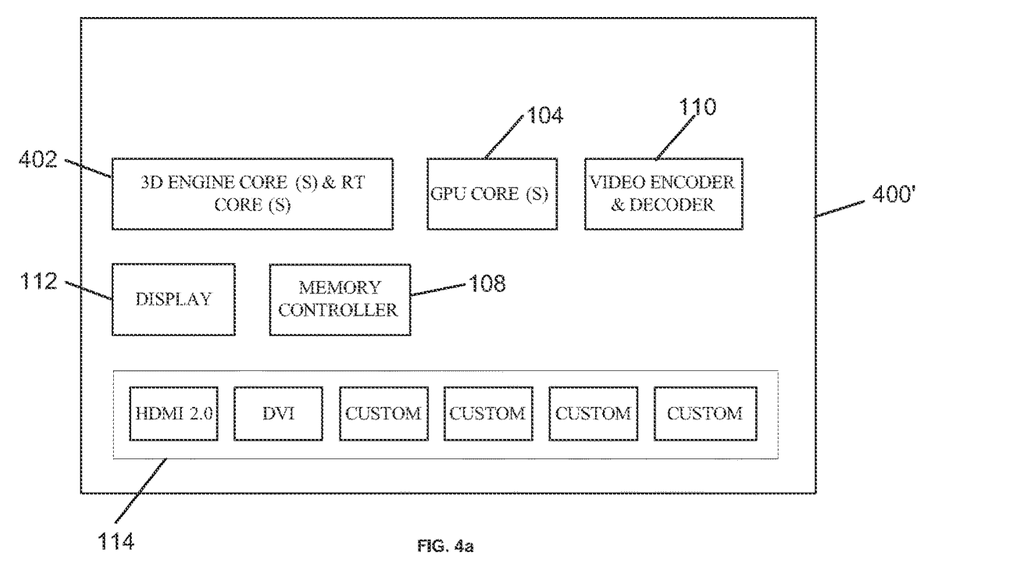
FIG. 4a shows another schematic view of a stand-alone discrete graphics processor according to one embodiment of the present disclosure.

FIG. 4a shows another embodiment of a graphics processor including a chip or chip assembly according to the present disclosure. The graphics processor 400' may include the same or like components as the graphics processor 400 of FIG. 4. Therefore, the same reference signs have been used to denote the same or like components. The graphics processor 400' may include one or more GPUs 104, a memory controller 108, a video encoder and decoder 110, a display 112, and a hardware interface 114, in any combination. Furthermore, the graphics processor 400' may include a plurality of hardwired game engines 402 that may be physically incorporated in the graphics processor 400', wherein each hardwired game engine 402 incorporates its own specialized ray trace engine optimized to augment the functionality of the game engine. The hardwired game engine 402 may be similar to the game engine 202' as shown in FIG. 2a.

As shown in FIGS. 4 and 4a one or more hardware game engines 102, 402 may be incorporated into a stand-alone discrete graphics processor chip or package, where the graphics processor chip or package may include one or more integrated circuits. Multiple integrated circuits in a package could be, for instance, connected to each other with the use of an interposer and/or by stacking and/or by using a similar fabrication process as discussed in detail above.

Figure 5:
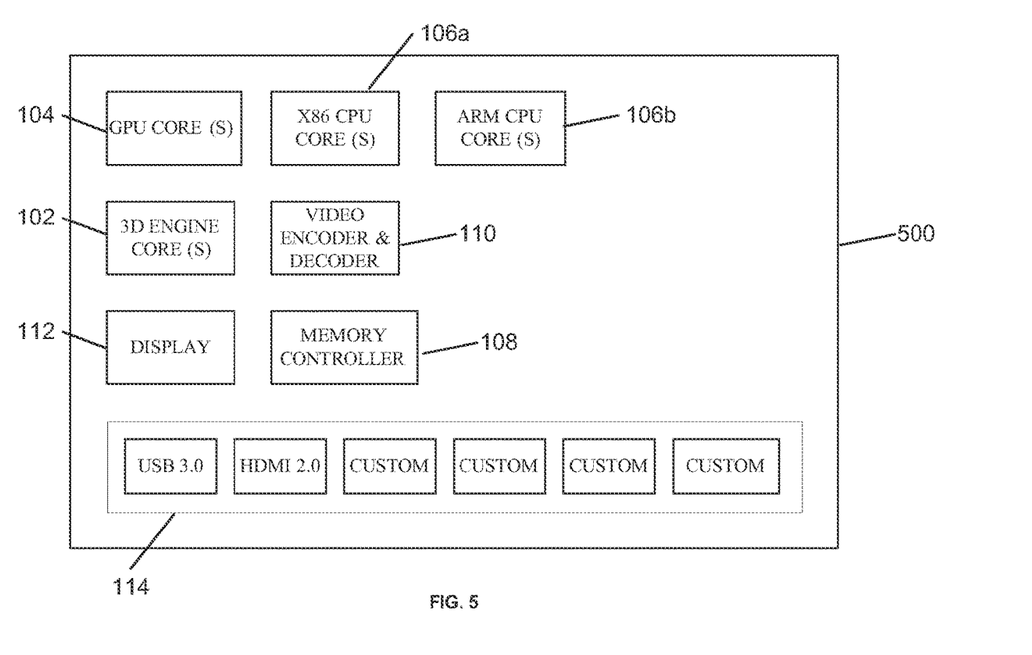
FIG. 5 illustrates an implementation of a SOC with a plurality of CPUs according to one embodiment of the present disclosure.
Figure 5A:
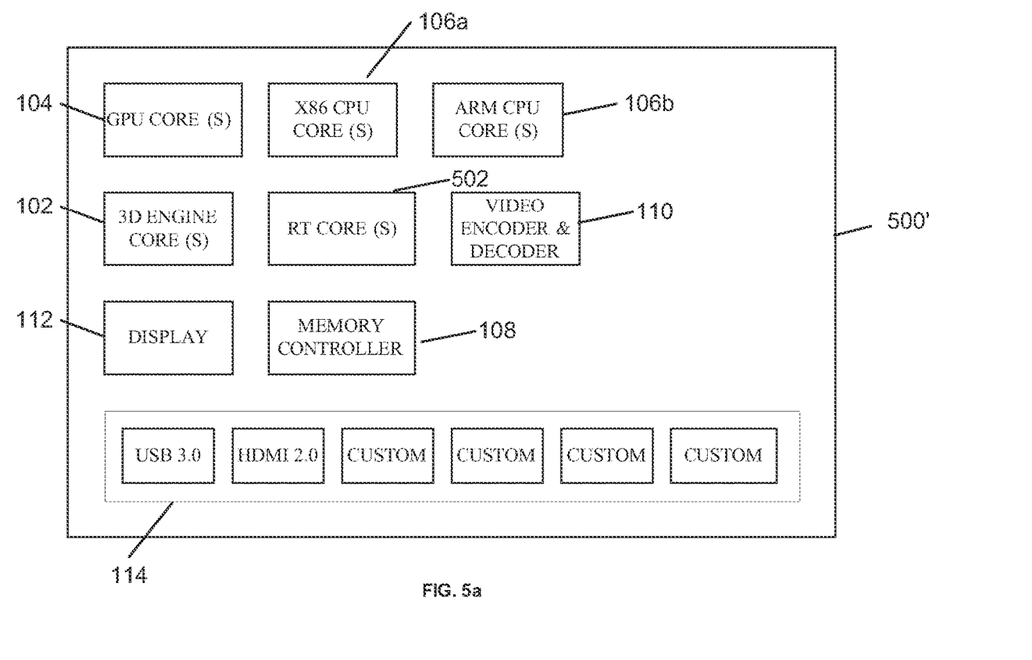
FIG. 5a shows another schematic view of a SOC according to one embodiment of the present disclosure.
Figure 5B:
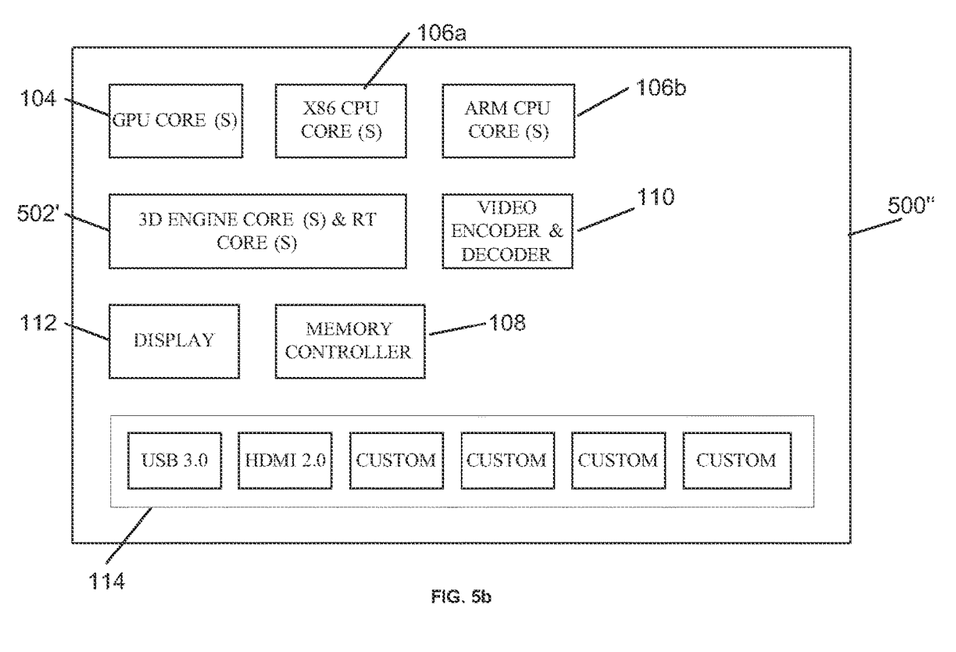
FIG. 5b shows yet another schematic view of a SOC according to one embodiment of the present disclosure.

FIGS. 5, 5a, and 5b disclose embodiments of chips according to the present disclosure. The chips 500, 500' and 500" may include components similar to the components as shown in FIGS. 1 to 4. Hence, same reference signs have been used in FIGS. 5, 5a, and 5b.

Chip 500 of FIG. 5 may include one or more game engines 102, one or more GPUs 104, a memory controller 108, a video encoder and decoder 110, a display 112, and a hardware interface 114, in any combination. As discussed with regard to FIGS. 1 and 2, individual components may be implemented by at least one processing core of the chip 500. The chip 500 may further include a plurality of CPUs 106a, 106b, where each CPU may be configured to execute instructions according to a different instruction set architecture (ISA). The hardwired game engine 102 and said multiple types of CPUs 106a, 106b may be incorporated into a single hardware device, such as a SOC. Using the plurality of CPUs 106a, 106b, the chip 500 may be able to run software compiled for different platforms, systems or architecture, for instance, but not limited to systems based on Intel's x86 architecture as commonly used in personal computers and systems based on the ARM instruction set, which may be typically used in mobile phones and tablets, by directing respective instructions to either CPU 106a and/or to CPU 106b. The chip 500 may include logic to determine, for each program code to be executed on the chip 500, an architecture for which the program code was compiled and to assign the program code to a respective CPU. Even though FIG. 5 shows only two types of CPUs 106a, 106b, it is to be understood that other types of CPUs 106a, 106b for execution of instructions according to other ISAs can be used without departing from the scope of the present disclosure.

As shown in FIG. 5a, chip 500' may include the same or similar components as discussed above with regard to chip 500, which are denoted in FIG. 5a using the same reference signs. Similar to chip 200 shown in FIG. 2, chip 500' may further include one or more ray trace engines 502. The one or more of hardwired game engines 102 may be physically incorporated on a SOC, together with the one or more ray trace engines 202 configured in such a way that the functionality of the hardwired game engines 102 is augmented. The chip 500' may incorporate multiple types of CPUs where each type of CPU is designed to execute a different ISA.

Chip 500" as shown in FIG. 5b may include the same or similar components as chips 500 and 500' discussed above with regard to FIGS. 5 and 5a. Therefore, the same reference signs have been used in FIG. 5b. Chip 500" may include one or more game engines 502' similar to the game engines 202' as discussed above with regard to FIG. 2a and the game engines 402 as discussed above with regard to FIG. 4a. The chip 502' may include the one or more hardwired game engines 502' physically incorporated on a SOC, where each hardwired game engine 502' may incorporate its own specialized ray trace engine optimized to augment the functionality of the respective game engine 502'. The chip 502' may incorporate multiple types of CPUs where each type of CPU may be designed to execute instructions according to a different ISA.

Figure 6:
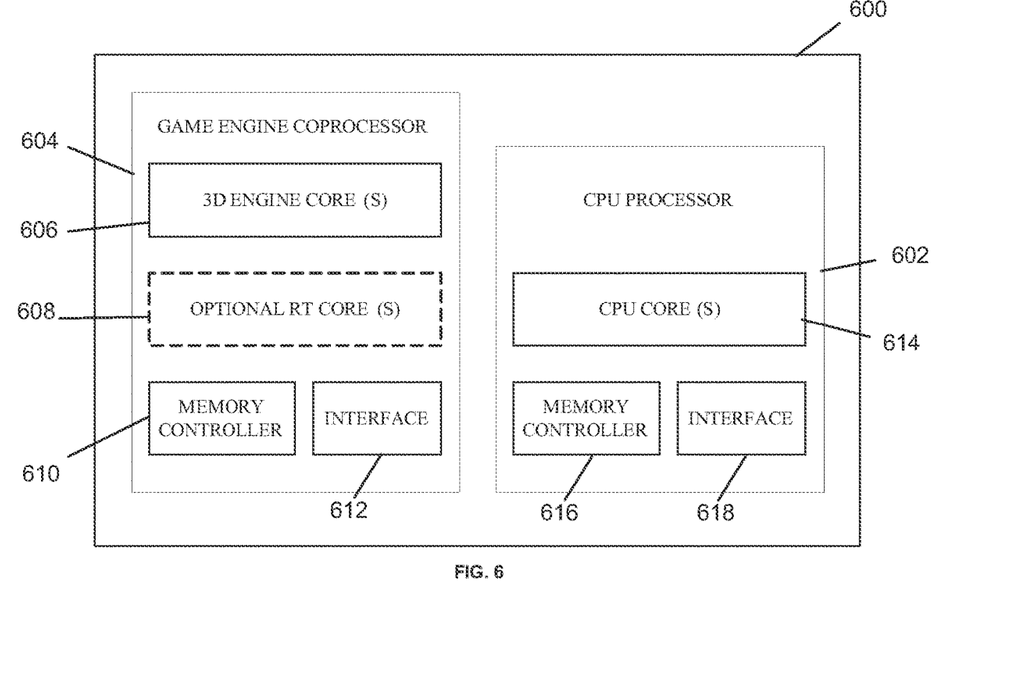
FIG. 6 shows a realization of a chip as a co-processor chip, according to one embodiment of the present disclosure.

FIG. 6 shows a system according to one embodiment of the present disclosure. The system 600 may include a CPU 602 together with a game engine coprocessor 604.

The game engine coprocessor 604 may comprise one or more chips as discussed above with regard to FIGS. 1 to 5. The game engine coprocessor 604 may incorporate one or more hardwired game engines 606 and, optionally, one or more ray trace engines 608. The optional ray trace engines 608 may be configured in such a way that the functionality of the game engine 606 may be augmented. The game engine coprocessor 604 may further comprise a memory controller 610 and a hardware interface 612 to communicate with the CPU 602. The CPU 602 may include one or more CPU cores 614, a memory controller 616, and a hardware interface 618.

The game engine coprocessor 604 can be understood as a separate chip, optionally with its own package, which may be connected to the CPU 602 via an interface bus, such as a PCI express bus, or any other bus interface or interconnect. The game engine coprocessor 604 may contain its own memory controller 610 where the memory may be located outside the game engine coprocessor 604 or on the game engine coprocessor 604.

The system 600 may further include one or more GPUs (not shown) and may comprise interfaces to connect to the one or more GPUs, for example, the PCI express bus. However, it is to be understood that any other interconnect or bus technology could be used to interconnect the CPU 602 with the game engine coprocessor 604 and the one or more GPUs.

The CPU 602 may issue commands to the game engine coprocessor 604, which may then prepare data sets and commands that can be communicated back to the CPU 602 or, via the interfaces 602, 618 to an external discrete GPU. A higher performance can be reached by offloading CPU tasks to the game engine coprocessor 604 which may contain circuits specifically designed for these tasks. The one or more tasks may include one or more of determining how objects cast shadows over other objects, determining how objects are reflected in other objects, or determining how the light falling on one object illuminates other surrounding objects, and the like. It is to be understood that this enumeration is not limited and can be extended by one or more other tasks as defined above.

The dedicated memory controller 610 on the game engine coprocessor 604 may allow the game engine coprocessor 604 to use its local memory to perform specific game engine tasks. This may advantageously improve performance by increasing I/O speed and bandwidth.

Figure 6A:
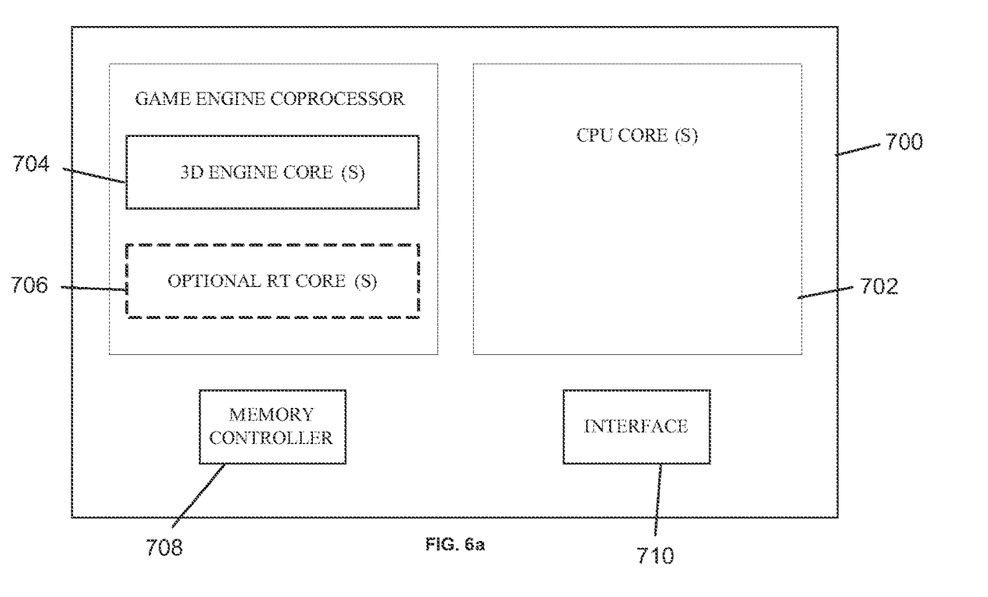
FIG. 6a shows a schematic view of a chip according to one embodiment of the present disclosure.

FIG. 6a shows a chip 700 according to one embodiment of the present disclosure. The chip 700 may include a CPU 702 with a single or a plurality of CPU cores. The chip 700 may further include one or more hardwired game engines 704 and optionally, one or more ray trace engines 706 that may be configured in such a way that the functionality of the game engine 704 is augmented. Hence, chip 700 may be regarded as a variation of system 600 as discussed above with regard to FIG. 6. However, chip 700 may integrate the system on a single chip or in a chip assembly. The chip 700 may further include a memory controller 708 and an interface 710. Accordingly, the chip 700 may be a single chip containing both the CPU 702 and the hardwired game engine 702 with the optional ray trace cores 706 on a single chip, where the memory controller 708 can be shared by both the CPU 702 and the game engines 704 to interface with external components, such as external GPUs. For example, as discussed above with regard to interfaces 612, 618, the interface 710 may be used to interface with one or more external discrete GPUs (not shown), via an interconnect or bus, such as the PCI express bus or any other type of bus or interconnect.

Figure 7A:
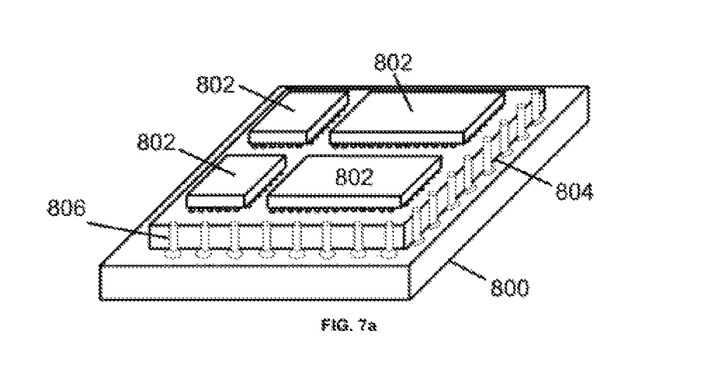
FIGS. 7a, 7b, and 7c show various examples of chip assemblies according to embodiments of the present disclosure.
Figure 7B:
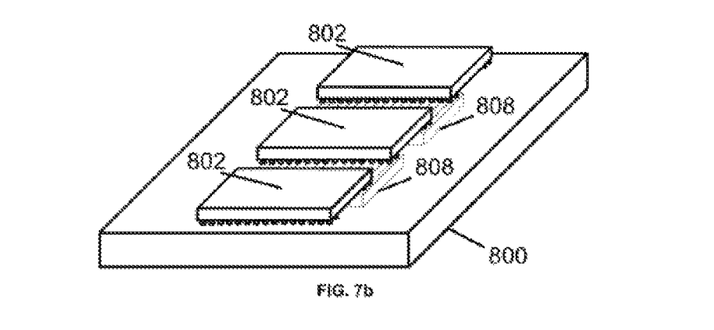
Figure 7C:
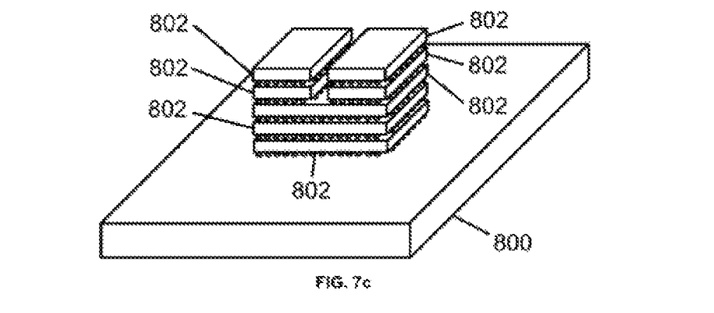

FIGS. 7a, 7b, and 7c show various examples of chip assemblies according to embodiments of the present disclosure. It is to be understood that a chip according to one embodiment of the present disclosure can be divided into multiple sub-chips and provided with required interconnections between the sub-chips, such as thousands or tens of thousands of interconnections, in such a way that the chip assembly functions in the same way as a single chip would function. Notwithstanding that embodiments of the present disclosure relate to the game engine on a chip, the chip may also be implemented as a chip assembly. Both a single chip as well as an implementation as a chip assembly, such as the chip assembly shown in FIGS. 7a, 7b, and 7c are, therefore, to be understood as a game engine on a chip according to embodiments of the present disclosure.

FIGS. 7a, 7b and 7c show exemplary chip assemblies according to one or more embodiments of the present disclosure. The chip assemblies may include a package substrate 800, a plurality of sub-chips 802, and an interposer 804. The chip assembly may be configured on the package substrate 800 via the interposer 804. The plurality of sub-chips 802 may together constitute the game engine according to the embodiments of the present disclosure and the plurality of sub-chips 802 may be interconnected via the interposer 804. The interposer 804 may itself be a large silicon die with metal interconnect layers that may be produced with chip production equipment. The metal interconnect layers on the interposer 804 may replace the interconnection layers that otherwise would interconnect various areas of a single chip.

In one embodiment shown in FIG. 7a, the interposer 804 can be connected to the package substrate 800 using through-silicon-vias 806.

FIG. 7b shows yet another embodiment of a chip assembly using another method of interconnecting the plurality of sub-chips 802 into a single game engine. In this exemplary embodiment, the various sub-chips 802 may be integrated into the chip assembly using micro-bridges 808 that may be embedded in the package substrate 800. The micro-bridges 808 may be themselves silicon dies with metal interconnect layers produced by chip production equipment. The metal interconnect layers on the micro-bridges 808 may replace the interconnection layers that otherwise would interconnect various areas of a single chip.

FIG. 7c shows yet another example embodiment of a chip assembly. In this example embodiment, the plurality of sub-chips 802 may be interconnected vertically into the chip assembly, placed on the package substrate 800. This may also be referred to as 3D chip stacking. Interconnecting sub-chips 802 vertically may use, for example, though-silicon-vias, such as the through-silicon-vias 806 of FIG. 7a, or use inductive coupling technology to enable near field wireless communication between 3D stacked chips.

While some embodiments have been described in detail, it is to be understood that aspects of the disclosure can take many forms. In particular, the claimed subject matter may be practiced or implemented differently from the examples described and the described features and characteristics may be practiced or implemented in any combination. The embodiments shown herein are intended to illustrate rather than to limit the invention as defined by the claims.

The invention claimed is:
1. A graphics processor package comprising:
   one or more hardware 3D game engine cores that incorporate a ray trace engine configured to augment functionality of the respective 3D game engine, wherein the one or more hardware 3D game engine cores are configured to govern behavior of 3D objects of a 3D scene and interaction with and between the 3D objects of the 3D scene;
   a graphics processing unit; and
   a hardware interface,
   wherein the graphics processing unit is connected to a video memory, and wherein the one or more hardware

3D game engine cores are configured to provide data to the graphics processing unit via the video memory.

2. The graphics processor package of claim 1, wherein the one or more hardware 3D game engine cores are configured to perform tasks comprising one or more of determining how the 3D objects cast shadows over other objects, determining how the 3D objects are reflected in other objects, and determining how light falling on one 3D object illuminates other surrounding objects.

3. The graphics processor package of claim 1, wherein the one or more hardware 3D game engine cores are implemented as field-programmable gate arrays (FPGAs).

4. The graphics processor package of claim 1, wherein the ray trace engine supports voxel space based cone tracing or G-buffer based tracing algorithms.

5. The graphics processor package of claim 1, wherein the interaction comprises interaction of light with and between the 3D objects of the 3D scene.

6. The graphics processor package of claim 1, wherein the video memory is coupled via the hardware interface to the one or more hardware 3D game engine cores, thereby enabling the one or more hardware 3D game engine cores to directly load and store data to the video memory.

7. A computing device comprising a graphics processor package, wherein the graphics processor package includes:
   one or more hardware 3D game engine cores that incorporate a ray trace engine configured to augment functionality of the respective 3D game engine, wherein the one or more hardware 3D game engine cores are configured to govern behavior of 3D objects of a 3D scene and interaction with and between the 3D objects of the 3D scene;
   a graphics processing unit; and
   a hardware interface,
   wherein the graphics processing unit is connected to a video memory, and wherein the one or more hardware 3D game engine cores are configured to provide data to the graphics processing unit via the video memory.

8. The computing device of claim 7, wherein the computing device comprises a virtual reality device.

9. The computing device of claim 7, wherein the computing device comprises a smart phone.

10. The computing device of claim 7, wherein the one or more hardware 3D game engine cores are configured to perform tasks comprising one or more of determining how the 3D objects cast shadows over other objects, determining how the 3D objects are reflected in other objects, and determining how light falling on one 3D object illuminates other surrounding objects.

11. The computing device of claim 7, wherein the one or more hardware 3D game engine cores are implemented as field-programmable gate arrays (FPGAs).

12. The computing device of claim 7, wherein the ray trace engine supports voxel space based cone tracing or G-buffer based tracing algorithms.

13. The computing device of claim 7, wherein the interaction comprises interaction of light with and between the 3D objects of the 3D scene.

14. The computing device of claim 7, wherein the video memory is coupled via the hardware interface to the one or more hardware 3D game engine cores, thereby enabling the one or more hardware 3D game engine cores to directly load and store data to the video memory.

* * * * *